United States Patent
Asano et al.

(10) Patent No.: US 6,654,098 B2
(45) Date of Patent: Nov. 25, 2003

(54) STAGE APPARATUS, EXPOSURE APPARATUS, AND DEVICE PRODUCTION METHOD

(75) Inventors: Toshiya Asano, Tochigi (JP); Takao Ukaji, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 156 days.

(21) Appl. No.: 09/749,927

(22) Filed: Dec. 29, 2000

(65) Prior Publication Data

US 2001/0015799 A1 Aug. 23, 2001

(30) Foreign Application Priority Data

Jan. 11, 2000 (JP) .......................... 2000-002495

(51) Int. Cl.[7] .......................... G03B 27/42; G05B 5/01; G05B 11/32
(52) U.S. Cl. .......................... 355/53; 318/623; 318/625
(58) Field of Search ............... 355/53, 72; 318/568.17, 318/592, 611, 623, 671, 687, 625; 356/375, 399, 400, 401; 250/492.2; 108/20; 248/566

(56) References Cited

U.S. PATENT DOCUMENTS

| | | | | |
|---|---|---|---|---|
| 5,467,720 A | * | 11/1995 | Korenaga et al. | 108/147 |
| 5,504,407 A | * | 4/1996 | Wakui et al. | 318/568.17 |
| 5,623,853 A | * | 4/1997 | Novak et al. | 355/53 |
| 5,684,856 A | * | 11/1997 | Itoh et al. | 250/453.11 |
| 5,959,427 A | * | 9/1999 | Watson | 318/560 |
| 6,028,376 A | * | 2/2000 | Osanai et al. | 310/12 |
| 6,449,030 B1 | | 9/2002 | Kwan | |
| 6,525,803 B2 | | 2/2003 | Kwan et al. | |

* cited by examiner

*Primary Examiner*—Alan A. Mathews
(74) *Attorney, Agent, or Firm*—Fitzpatrick, Cella, Harper & Scinto

(57) ABSTRACT

A stage apparatus is disclosed, which includes first and second movable members movable in directions parallel to a reference plane, a first actuator for generating a force between the first movable member and the second movable member, a second actuator for generating a force between a structure defining the reference plane and the second movable member. A first control system controls the position of the first movable member, using the first actuator, and a second control system controls the position of the second movable member, using the second actuator in synchronization with the control of the first control system.

27 Claims, 11 Drawing Sheets

STAGE APPARATUS, EXPOSURE APPARATUS, AND DEVICE PRODUCTION METHOD

BACKGROUND OF THE INVENTION

1. Field of the Invention

The present invention relates to a stage apparatus used in a semiconductor exposure apparatus or a testing apparatus, for positioning an object to be exposed, a mask having an original pattern to be transferred, or an object to be tested, to a desired position. The present invention also relates to an exposure apparatus using such a stage apparatus and to a method of producing a device using such an exposure apparatus.

2. Description of the Related Art

Steppers and scanners are widely used as exposure apparatuses in the production of semiconductor devices. A stepper is an apparatus for projecting an image of a pattern formed on a reticle onto a wafer via a projection lens so as to form an image of the pattern with a reduced size on the wafer while moving, in a step-by-step fashion, the semiconductor wafer placed on a stage apparatus and below the projection lens, thereby exposing the wafer shot by shot. In a scanner, on the other hand, a semiconductor wafer placed on a wafer stage and a reticle placed on a reticle stage are moved relative to a projection lens, and exposure light in the form of a slit is emitted when the wafer and the reticle are being moved and scanned so as to project a reticle pattern onto the wafer. The steppers and scanners are widely used as exposure apparatuses because of their high performance in terms of the resolution and registration accuracy.

FIG. 5 illustrates an example of a conventional exposure apparatus. As shown in FIG. 5, the exposure apparatus is constructed on a base frame 1 installed on a floor of a factory. A lens barrel base 2 is supported on the base frame 1. A reduction optical system 3, a reticle stage 4 on which a reticle including an original pattern to be transferred is placed, and an alignment optical system (not shown) are disposed on the lens barrel base 2. In order to avoid the influence of vibrations of the floor on which the apparatus is installed, the lens barrel base 2 is placed on a vibration isolating mechanism 5 using an air spring or the like. In the case of an exposure apparatus of the stepper type, the reticle stage 4 is driven within a small range. In contrast, in the case of an exposure apparatus of the scanner type, the reticle stage 4 is scanned in synchronization with the scanning of a wafer stage 6 which will be described later.

A wafer stage base 7 serving as a guide for horizontally guiding the wafer stage 6 is disposed on the base frame 1. The wafer stage 6 is made up of two stages which can be moved in two directions (X and Y directions) perpendicular to each other so as to carry a wafer in a horizontal plane. More specifically, the wafer stage 6 is made up of a Y stage movable in the Y direction and an X stage which is disposed on the Y stage and which is movable in the X direction. Hydrostatic bearings are disposed between the wafer stage base 7 and the X and Y stages and between the X stage and the Y stage such that the X and Y stages can move with very low friction in the intended moving directions but such that they are supported very rigidly in the direction perpendicular to the moving plane. Therefore, when the Y stage is driven, the X stage moves together with the Y stage. A magnet serving as a mover of a linear motor is disposed on the Y stage, and a stator (in the form of a coil) of the linear motor is disposed on the stage base 7 so that the Y stage is driven by a force generated between the mover and the stator of the linear motor. Similarly, a mover of a linear motor is disposed on the X stage, and a stator of the linear motor is disposed on the Y stage such that a driving force is generated between the mover and the stator. The reaction force of the driving force applied to the X stage acts upon the Y stage and is received by the guide formed on the stage base 7, and thus the X stage is driven in the X direction with respect to the stage base 7.

A fine adjustment stage 8, capable of finely adjusting the position in a rotational direction in the XY plane, in a direction normal to the XY plane, in a rotational direction about the X axis, and in a rotational direction about the Y axis, is disposed on the X stage (the fine adjustment stage 8 will not be described in further detail herein). A wafer to be exposed is placed on a wafer chuck (not shown) on the fine adjustment stage 8. The position of the wafer stage 6 is measured using a high-resolution laser interferometer. In order to achieve high precision positioning of the wafer stage 6, a stage control system is used although it is not shown in FIG. 5. On the basis of the target value of the wafer stage position generated by a main controller (not shown) and the wafer stage position measured by the laser interferometer, the stage control system sends a drive command signal to an actuator of the wafer stage 6. In accordance with the drive command signal, the respective linear motors of the wafer stage 6 are driven by linear motor driving amplifiers (not shown) and generate driving forces in particular directions.

One measure of the performance of the exposure apparatus is the number of wafers which can be handled per unit time (throughput). The wafer stage 6 is moved when a wafer is exchanged, alignment (positioning of the wafer with respect to the exposure optical system) is performed, and the wafer is moved such that each shot area (area to be exposed) of the wafer comes to an exposure position. The moving time of the wafer stage 6 has a large ratio to the total time required to process one wafer. Therefore, to increase the throughput, it is necessary to reduce the time required to move the wafer stage 6 in the X and Y directions. In order to quickly move the wafer stage, it is necessary not only to increase the moving speed but also to quickly perform the acceleration and deceleration. The driving force of the wafer stage 6 is given by the product of the mass of the wafer stage 6 and the acceleration exerted thereon. The reaction force of the driving force applied to the Y stage is transmitted to the base frame 1 via the stage base 7 and further to the floor. The reaction force of the driving force applied to the X stage is transmitted to the base frame 1 via the stage base 7 and further to the floor. If the reaction forces of the driving forces applied to the X and Y stages are great, the base frame 1 and the floor are vibrated. The vibration of the base frame 1 or the floor causes degradation in the positioning accuracy of the wafer stage 6. Besides, because the performance of the vibration isolating mechanism is limited, the vibration is also transmitted to the lens barrel base 2, and the exposure accuracy is degraded. Furthermore, the vibration of the floor exerts an influence upon other apparatus installed at nearby locations.

One known technique to avoid the transmission of the reaction force of the stage driving force to the base frame 1 and the floor is shown in FIG. 6. In this technique, a base 9 is disposed upon a floor such that the base 9 is allowed to freely move in a horizontal direction, and a stage 10 is supported on the base 9 such that the stage 10 is allowed to freely move in the horizontal direction. If a driving force f is applied between the base 9 and the stage 10, an acceleration of α=f/m is exerted upon the stage 10, and an acceleration of β=f/M is exerted upon the base 9 in a direction opposite to the direction in which the stage 10 is accelerated, where m is the mass of the stage 10 and M is the mass of the base 9. That is, in response to accelerations inversely proportional to the masses applied to the stage 10 and the base 9, the stage 10 and the base 9 are moved. However, the reaction forces of the driving force result in the accelerations, and they are cancelled and are not transmitted to the floor.

In the system shown in FIG. 6, because the motion of the stage 10 always occurs with respect to the base 9, the position of the stage 10 with respect to a position measurement reference (floor, for example) disposed in the outside of the system must have a particular relation with the relative position between the stage 10 and the base 9. That is, when displacements are measured with respect to the measurement reference 11 as shown in FIG. 7, the displacement Ys of the Y stage 10 in the Y direction and the displacement Yb of the base 9 in the Y direction must always satisfy equation 3 described below.

$$Yb = -m/M \cdot Ys \quad (3)$$

However, equation (3) holds only under ideal conditions, and it will easily break. The stage 10 can be easily positioned at a desired position by means of feedback control on the basis of a position measurement signal of a measurement system. However, the base 9 moves in a completely passive manner, and it moves only by the reaction force of the driving force applied to the stage 10.

As described below, the stage base system can encounter disturbances which can cause a deviation from equation (3). Ideally, the base 9 is supported by a guide such that the base 9 is allowed to freely move over a floor in a horizontal direction. In practice, however, the guide produces friction which varies depending upon the moving direction. Furthermore, wires of the driving coil or the like act as springs. Moreover, the floor on which the base 9 is supported is not necessarily formed in a perfect horizontal plane. Even if the inclination of the floor is not so large that the base 9 is displaced toward a lower position on the floor when the stage 10 is at rest, the inclination of the floor can cause the base 9 to move by different distances depending upon the direction in which the stage 10 moves. When the stage 10 moves at low velocities with a small acceleration, if the reaction force of the driving force applied to the stage 10 is smaller than the static friction of the base 9, the base 9 is not moved at all. Therefore, if the stage 10 is driven repeatedly at such low velocities, the relative position between the stage 10 and the base 9 deviates from that which satisfies equation (3). In an extreme case, the stage 10 and the base 9 come to positions shown in FIG. 8, and the stage 10 becomes unable to further move in the positive Y direction.

SUMMARY OF THE INVENTION

In view of the above, it is an object of the present invention to provide a stage apparatus which always satisfies equation (3) and which exerts a reaction force upon a floor or the like. It is another object of the present invention to provide a stage apparatus characterized in that a moving stage can be moved to any desired position within an allowed range while maintaining a predetermined positional relationship between the moving stage and a stage base. It is still another object of the present invention to provide an exposure apparatus using such a stage apparatus. It is still another object of the present invention to provide a method of producing a device using such an exposure apparatus.

According to a first aspect of the present invention, there is provided a stage apparatus including a first movable member movable in a direction parallel to a reference plane; a second movable member movable in a direction parallel to the reference plane; a first actuator for generating a force between the first movable member and the second movable member; a second actuator for generating a force between the reference plane and the second movable member; a first control system for controlling the position of the first movable member, using the first actuator; and a second control system for controlling the position of the second movable member, using the second actuator in synchronization with the control of the first control system.

In this stage apparatus according to the present invention, when the mass of the first movable member is denoted by m, a target value of the position of the first movable member controlled by the first control system is denoted by Ys, the mass of the the second movable member is denoted by M, and a target value of the position of the second movable member is denoted by Yb, the following relationship preferably holds:

$$Yb = -m/M \cdot Ys.$$

Preferably, the stage apparatus further comprises an initial position actuator for moving the first movable member and the second movable member to their initial positions.

The initial position actuator may perform the moving to the initial positions by moving the first movable member while maintaining the second movable member at a fixed position.

The stage apparatus may further include a first position measurement system for measuring the position of the first movable member and a second position measurement system for measuring the position of the second movable member.

The first control system may control the position of the first movable member on the basis of the result of the measurement performed by the first position measurement system and also on the basis of the target value of the position, and the second control system may control the position of the second movable member on the basis of the result of the measurement performed by the second position measurement system and also on the basis of a target value depending upon the target value of the position.

Preferably, a member serving as a position reference used in the position measurement performed by the first position measurement system is formed on a structure vibration-isolated from the reference plane.

Alternatively, a member serving as a position reference used in the position measurement performed by the first position measurement system may be formed integrally with the reference plane.

Preferably, a member serving as a position reference used in the position measurement performed by the second position measurement system is formed on a structure vibration-isolated from the reference plane.

Alternatively, a member serving as a position reference used in the position measurement performed by the second position measurement system may be formed integrally with the reference plane.

More preferably, the first movable member and the second movable member are both supported on the reference plane.

Preferably, the second movable member is supported on the reference plane, and the first movable member is supported on the second movable member.

Preferably, the first movable member and the second movable member are movable in directions along two axes parallel to the reference plane.

Preferably, the first movable member is a movable stage, and the second movable member is a stage base or a stator of the first actuator.

Preferably, the first actuator is a linear motor.

According to a second aspect of the present invention, there is provided a stage apparatus including a first movable member movable in a direction parallel to a reference plane; a second movable member movable in a direction parallel to the reference plane; an actuator for generating a force between the first movable member and the second movable member; a fixing mechanism for fixing the second movable member at an arbitrary position within the moving range of the second movable member; a position measurement system for measuring the position of the second movable member; and a control system for controlling the position of the first movable member, using the actuator.

Preferably, the stage apparatus according to the present invention further comprises a controller which positions the first movable member so as to satisfy the following relationship:

$$Yb=-m/M \cdot Ys$$

where m is the mass of the first movable member, Ys is the target value of the position of the first movable member controlled by the first control system, M is the mass of the the second movable member, and Yb is the target value of the position of the second movable member, wherein the controller releases the second movable member from the fixed state after completion of the positioning of the first movable member.

Preferably, the stage apparatus further comprises a judging unit for judging whether the relationship is satisfied.

If the judging unit judges that the relationship is not satisfied, the controller may again perform the driving to the initial position.

Preferably, a member serving as a position reference used by the position measurement system is formed on a structure vibration-isolated from the reference plane.

Alternatively, a member serving as a position reference used by the position measurement system may be formed integrally with the reference plane.

Preferably, the first movable member and the second movable member are both supported on the reference plane.

More preferably, the second movable member is supported on the reference plane, and the first movable member is supported on the second movable member.

Preferably, the first movable member and the second movable member are movable in directions along two axes parallel to the reference plane.

Preferably, the first movable member is a movable stage, and the second movable member is a stage base or a stator of the first actuator.

Preferably, the first actuator is a linear motor.

According to a third aspect of the present invention, there is provided an exposure apparatus including a first movable member movable in a direction parallel to a reference plane; a second movable member movable in a direction parallel to the reference plane; a first actuator for generating a force between the first movable member and the second movable member; a second actuator for generating a force between the reference plane and the second movable member; a first control system for controlling the position of the first movable member, using the first actuator; and a second control system for controlling the position of the second movable member, using the second actuator in synchronization with the control of the first control system.

According to a fourth aspect of the present invention, there is provided an exposure apparatus including a first movable member movable in a direction parallel to a reference plane; a second movable member movable in a direction parallel to the reference plane; an actuator for generating a force between the first movable member and the second movable member; a fixing mechanism for fixing the second movable member at an arbitrary position within the moving range of the second movable member; a position measurement system for measuring the position of the second movable member; and a control system for controlling the position of the first movable member, using the actuator.

According to a fifth aspect of the present invention, there is provided a method of producing a device, including the steps of preparing an exposure apparatus according to the third aspect of the present invention and performing exposure using the exposure apparatus.

According to a sixth aspect of the present invention, there is provided a method of producing a device, including the steps of preparing an exposure apparatus according to the fourth aspect of the present invention and performing exposure using the exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

Figure 1:
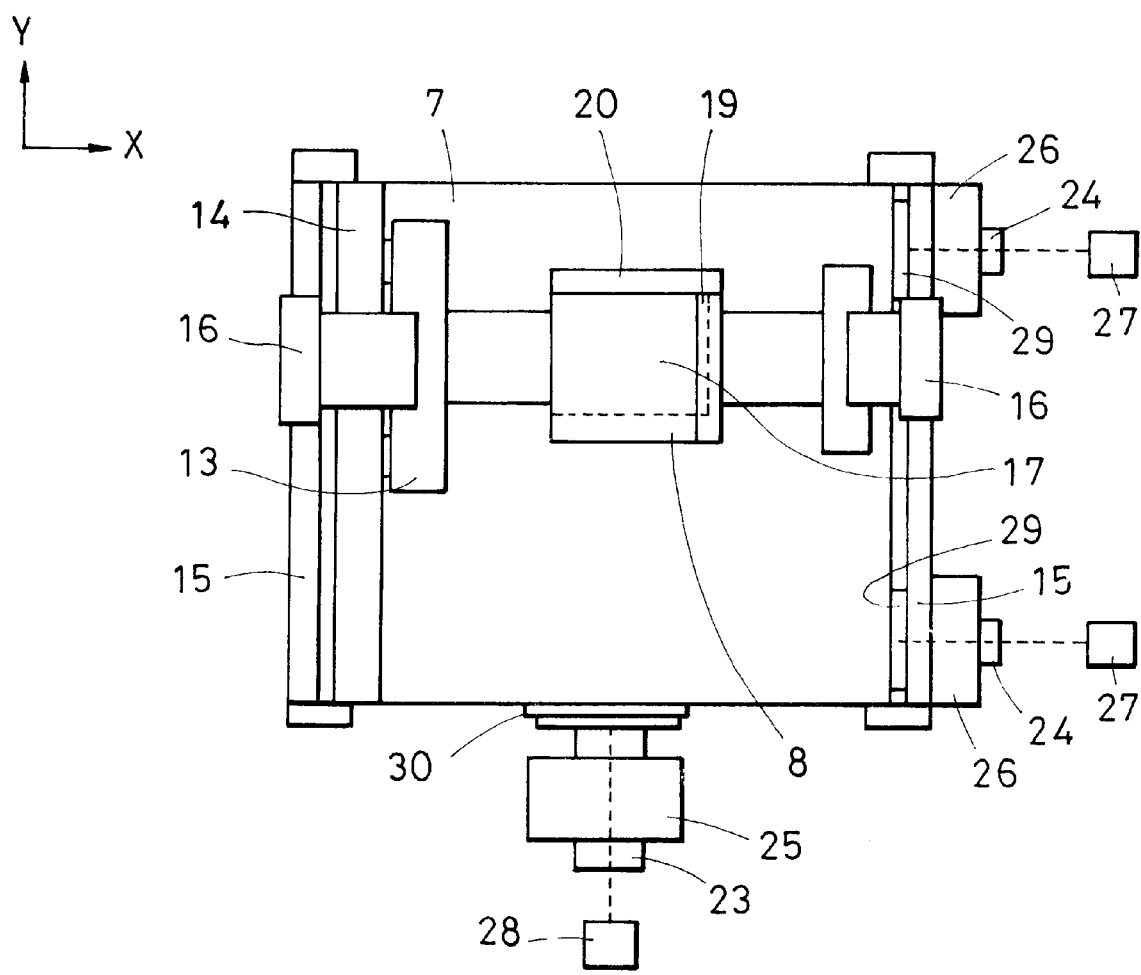
FIG. 1 is a top view of a wafer stage according to an embodiment of the present invention.
Figure 2:
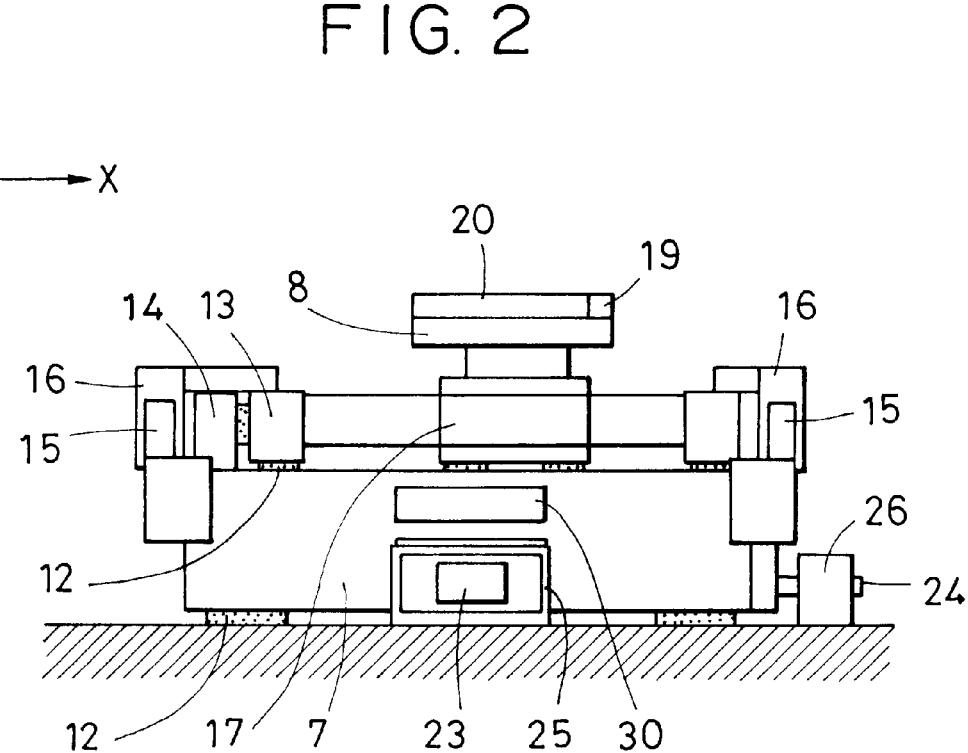
FIG. 2 is a front view of the wafer stage shown in FIG. 1.
Figure 3:
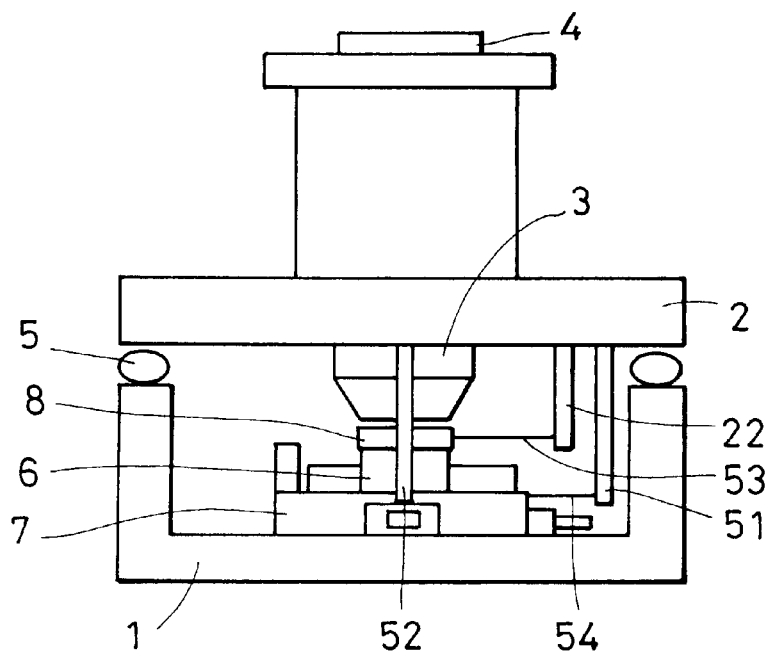
FIG. 3 is a front view of an exposure apparatus including the wafer stage shown in FIG. 1.

FIG. 1 is a top view of a stage apparatus used as a wafer stage, according to an embodiment of the present invention, and FIG. 2 is a front view thereof. FIG. 3 is a front view of an exposure apparatus including the wafer stage shown in FIG. 1.

As shown in these figures, a stage base 7 for supporting the wafer stage 6 is disposed on a base frame 1 of an exposure apparatus rigidly installed on a floor via a hydrostatic bearing. The upper surface of the base frame 1 is mirror-finished, and the stage base 7 is guided by the hydrostatic bearing 12 such that the stage base 7 can freely move without substantially encountering friction. A Y stage 13 constituting the wafer stage 6 is disposed on the stage base 7. A highly rigid hydrostatic guide including a pressurizing magnet and a hydrostatic bearing 12 is disposed on the bottom of the Y stage 13 and also on a yaw-direction guiding surface. The upper surface of the stage base 7 and the stage side of the yaw-direction guide 14 firmly disposed on the stage base 7 are mirror-finished, thereby guiding the Y stage 13 such that the Y stage 13 can freely move in the Y direction with respect to the stage base 7.

The stators (made up of coils) 15 of two Y direction linear motors extending in the Y direction are disposed on the stage base 7. The Y stage 13 is fixed to the movers (made up of magnets) 16 of the Y direction linear motors via connecting plates such that the Y stage 13 can be driven in the Y direction by driving forces generated by the linear motors. The reaction force of the driving force in the Y direction is transmitted to the stage base 7 via the stators 15 of the linear motors.

An X stage 17 is disposed on the Y stage 13 such that the X stage 17 partially surround the Y stage 13. A hydrostatic guide is formed on the bottom of the X stage 17, as with the Y stage 13. A hydrostatic guide made up of a hydrostatic bearing is formed between the X stage 17 and the Y stage 13 such that the X stage 17 can move in the X direction across the Y stage 13 and such that when the Y stage 13 moves in the Y direction, the X stage 17 moves together with the Y stage 13. A stator (made up of a coil), extending in the X direction, of an X direction linear motor is disposed on the Y stage 13 and a mover (made up of a magnet) of the X linear motor is disposed on the X stage 17 thereby forming the X linear motor for generating a driving force in the X direction. The driving force generated by the X direction linear motor drives the X stage 17, and the reaction force thereof is transmitted to the stage base 7 via the Y stage 13 and the yaw direction guide 14.

A fine adjustment stage 8, capable of rotating in a ωz direction in the XY plane and in directions ωx and ωy about the X and Y axes and also capable of moving in a Z direction, is disposed on the X stage 17. The structure of this fine adjustment stage 8 is disclosed, for example, in U.S. Pat. No. 5,858,587. Note that the fine adjustment stage 8 is rigidly coupled, in the XY directions, with the x stage 17. An X interferometer mirror 19 and a Y interferometer mirror 20 for measuring the displacements of the fine adjustment stage 8 in the X and Y directions are disposed on the fine adjustment stage 8. Using these mirrors, laser interferometers measure the displacements of the fine adjustment stage 8 in the X and Y directions with respect to the lens barrel base 2, and more specifically, with respect to a wafer stage X direction laser interferometer reference 22. These interferometers also measure the displacements in the ωz, ωz and ωy directions.

A mover (coil) 23 of the Y direction linear motor for driving the stage base 7 in the Y direction is disposed at a location on the line extending through the barycenter of the stage base 7 in the X direction. Two movers (coils) 24 of the X direction linear motors for driving the stage base 7 in the X direction are disposed at locations on both sides of the barycenter of the stage base 7 in the Y direction. The movers 23 and 24 are used, together with a stator (magnet) 25 of the stage base Y direction linear motor and a stator (magnet) 26 of the state base X direction linear motor disposed on the base frame 1, to generate driving forces for driving the stage base 7 in the Y and X directions, respectively. Furthermore, a moment in a rotational direction in the XY plane can be generated by a difference in driving force between the two stage base X direction linear motors formed by the movers 24 and the stators 26. The displacements of the stage base 7 in the X and Y directions and in a rotational direction in the XY plane are measured by the two stage base X direction laser interferometers 27 and the stage base Y direction laser interferometer 28. The measurement by these stage base laser interferometers is performed with respect to the lens barrel stage 1, as in the measurement of the positions of the X and Y stages. More specifically, a stage base X direction interferometer reference 51 and a stage base Y direction interferometer reference 52 fixed to the lens barrel base 2 are used as the measurement references. A stage base X direction laser interferometer mirror 29 for use by the stage base X direction laser interferometer 27 and a stage base Y direction laser interferometer mirror 30 for use by the stage base Y direction laser interferometer 28 are disposed on the stage base 7.

Each stage base linear motor is formed such that a sufficiently large margin is obtained for the motion of the stage base 7 in the direction perpendicular to the driving direction. That is, the stage base linear motors are formed such that the motion of the stage base 7 in the X direction does not cause the stator 25 and the mover 23 of the stage base Y direction linear motor to be brought into contact with each other, and such that the motion of the stage base 7 in the Y direction does not cause the stator 26 and the mover 24 of the stage base X direction linear motor to be brought into contact with each other.

Figure 4:
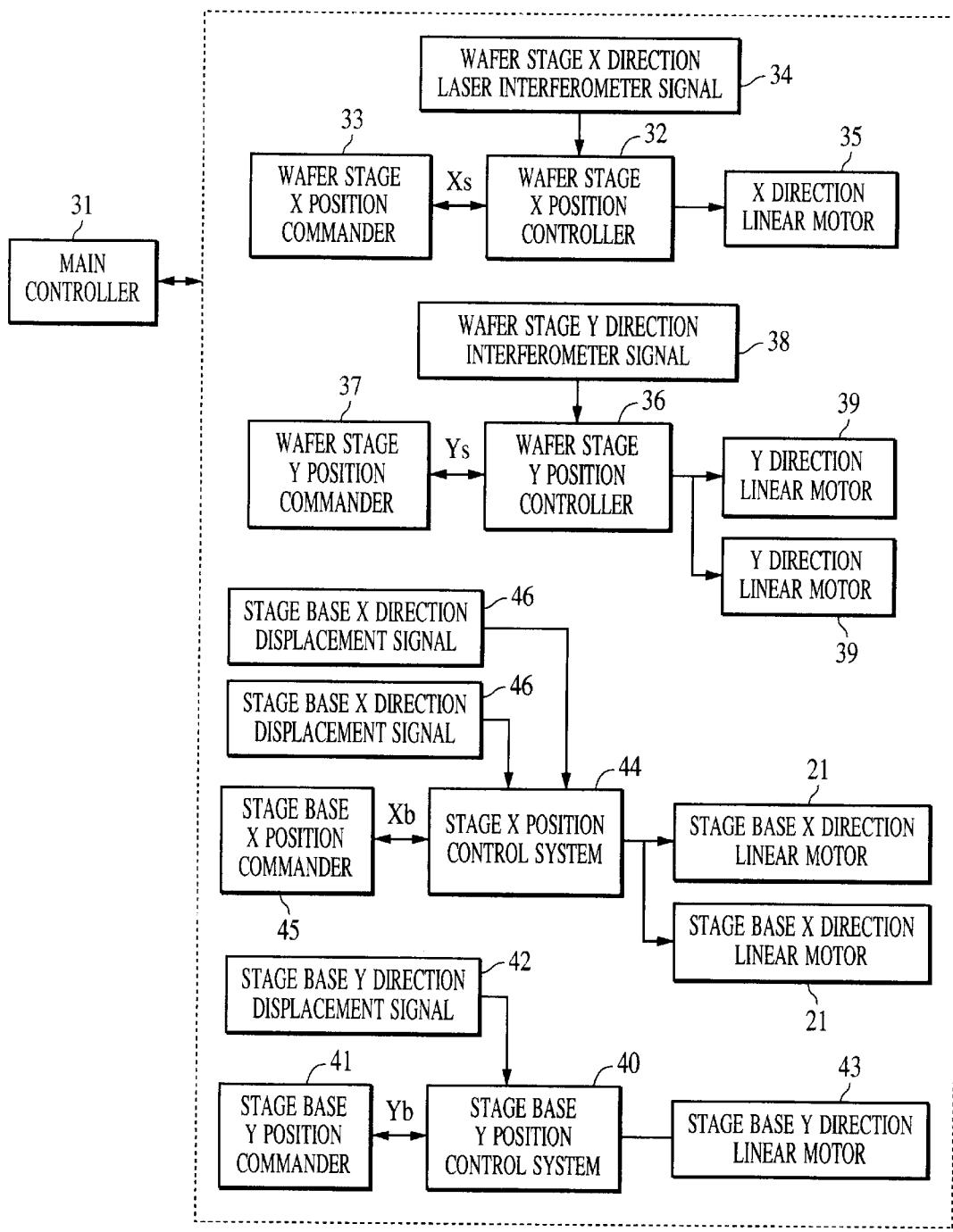
FIG. 4 is a block diagram illustrating the control system of the wafer stage shown in FIG. 1.
Figure 5:
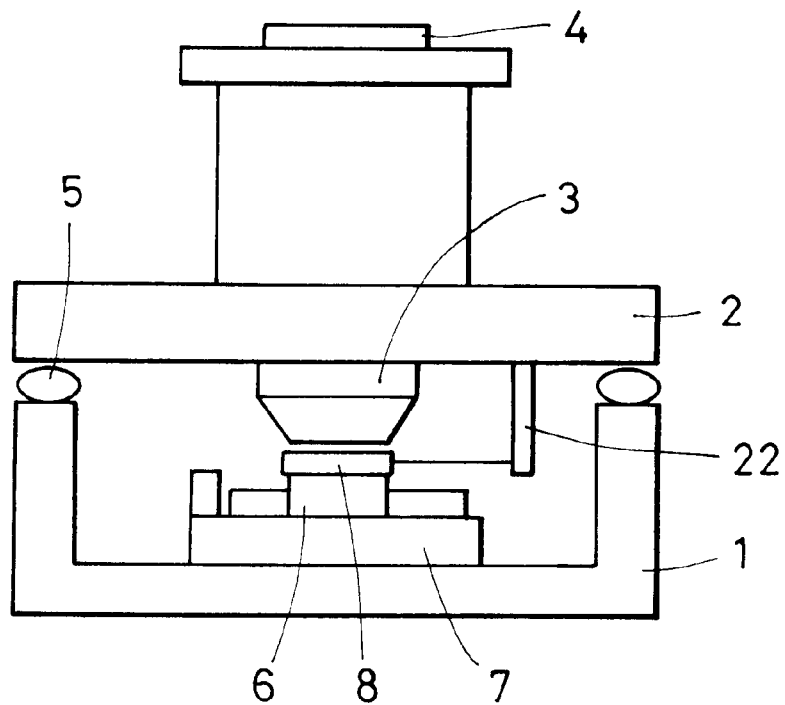
FIG. 5 is a schematic diagram illustrating an example of a conventional exposure apparatus.
Figure 6:
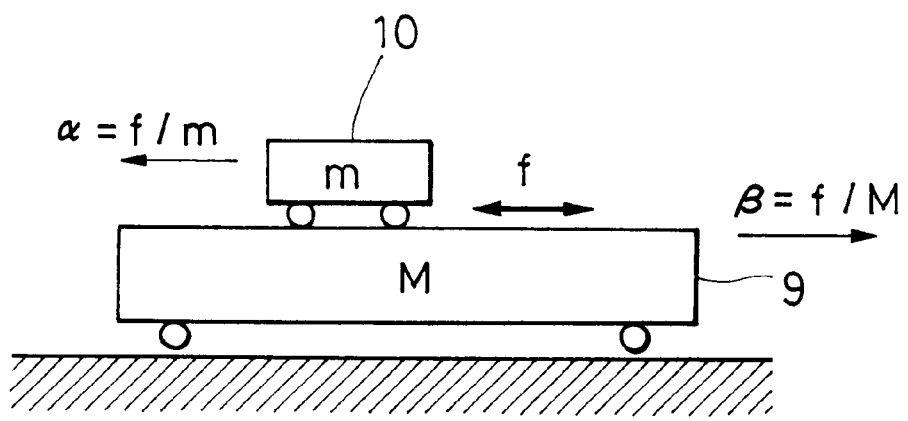
FIG. 6 is a schematic diagram illustrating an example of a conventional positioning stage.
Figure 7:
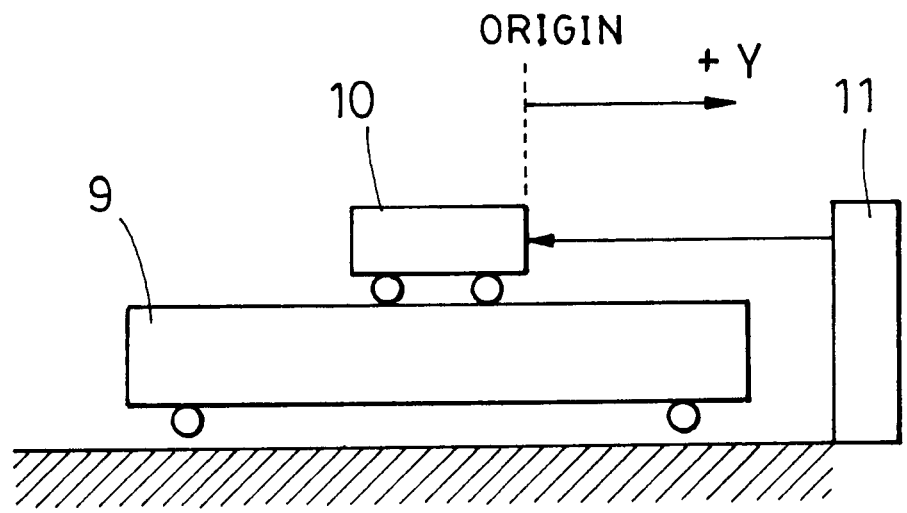
FIG. 7 is a schematic diagram illustrating the operation of the conventional positioning stage.
Figure 8:
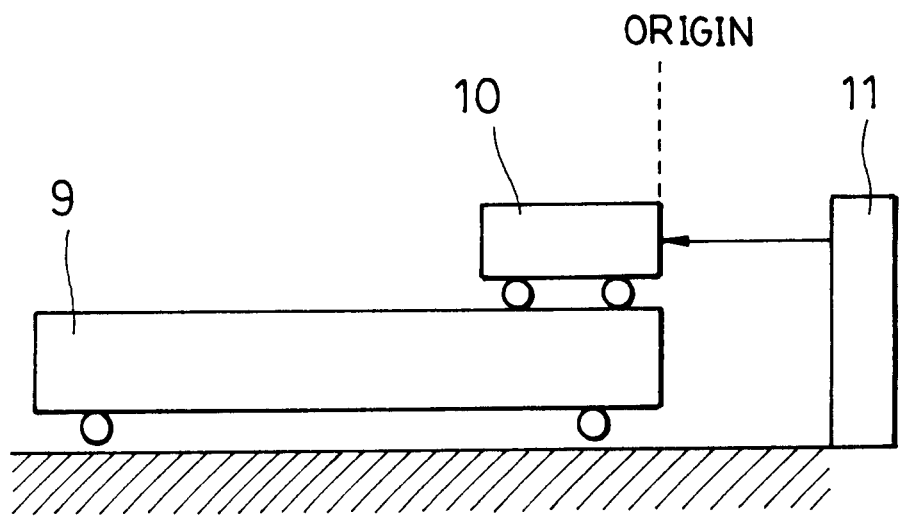
FIG. 8 is a schematic diagram illustrating a problem of the conventional positioning stage.

FIG. 4 is a block diagram illustrating the control system of the wafer stage 6. Note that parts associated with the fine adjustment stage 8 are not shown in FIG. 4. In FIG. 4, a main controller 31 serves to control the operation of the entire apparatus. The control system for controlling the wafer stage 6 is surrounded by a broken line in FIG. 4. The wafer stage control system receives and transmits wafer stage position commands and data representing the measured stage positions to and from the main controller 31, although no further description of such transmission is given herein. In FIG. 4, a wafer stage X position control system 32 positions the X stage 17 by driving the X direction linear motor 35 by means of feedforward control of the driving force applied to the X stage and by means of feedback control of the target position on the basis of a wafer stage driving command received from the main controller 31, a value representing the target position received from a wafer stage X position commander 33, and a wafer stage X direction laser interferometer signal 34. Similarly, a wafer stage Y control system 36 positions the Y stage 13 by driving the two Y direction linear motors 39 on the basis of a wafer stage driving command received from the main controller 31, a value representing the target position received from a wafer stage Y position commander 37, and a wafer stage Y direction laser interferometer signal 38. In the above operation, the movement of the X stage 17 results in a shift in the overall barycenter of the Y stage 13, the X stage 17, and the fine adjustment stage 8, that is, the barycenter of the total moving mass in the Y direction. The wafer stage Y control system 36 also controls the output power of the respective linear motors 39 such that the resultant of forces generated by the two Y direction linear motors 39 is exerted upon the barycenter of the total moving mass in the Y direction, on the basis of information about the position of the X stage 17.

A stage base Y position control system 40 positions the stage base 7 in the Y direction by driving the stage base Y direction linear motor 43 by means of feedback control on the basis of a value representing the target Y position received from a stage base Y position commander 41 and a Y direction displacement signal 42 of the stage base 7. Similarly, a stage base X position control system 45 positions the stage base 7 in the X direction on the basis of a value representing the target X position received from a stage base X position commander 45 and two X direction displacement signals 46 of the stage base 7. Herein, the displacement of the stage base 7 in the rotational direction ($\omega z$) in the XY plane is determined from the difference between the two X direction displacement signals 46 of the stage base 7 and the distance between the two displacement measurement units 27. The stage base X position control system 44 also controls the above rotational displacement to be zero by controlling the control signals applied to the two stage base X direction linear motors 21. The moment which causes the stage base 7 to rotate in the rotation direction $\omega z$ is generated as a result of movement of the wafer stage 6. That is, relative movement between the wafer stage 6 and the stage base 7 results in a shift in the point where the driving force of the linear motor is applied to the wafer stage 6 from the barycenter of the stage base 7, and thus a moment is generated. The wafer stage X position control system 44 calculates the moment from the information representing the position of the wafer stage 6 and the information representing the driving force applied to the wafer stage 6, and controls the two stage base X direction linear motors 21 so as to cancel the moment by means of feedforward control. The force for canceling the moment is transmitted to the base frame 1 via the stators 26 of the respective stage base X direction linear motors. However, substantially no problem occurs because the force is not so large as to vibrate the base frame 1 or the floor.

The control of positioning of the stage base 7 in the X and Y directions, which is the principal objective of the present invention, is described below. The target values Xb and Yb of the position of the stage base 7, generated by the stage base X position commander 45 and the stage base Y position commander 41, are given by the following equations:

$Yb = -my/M \cdot Ys$ $Xb = -mx/M \cdot Xs$ (6)

where

Yb is the target value of the position of the stage base 7 in the Y direction,

Xb is the target value of the position of the stage base 7 in the X direction,

Ys is the target value of the position of the Y stage 13,

Xs is the target value of the position of the X stage 17, my is the total moving stage mass in the Y direction (the sum of the masses of the Y stage 13, the X stage 17, and the fine adjustment stage 8)

mx is the total moving stage mass in the X direction (the sum of the masses of the X stage 17 and the fine adjustment stage 8), and M is the mass of the stage base.

Equation (6) implies that when driving forces are generated by the linear motors of the wafer stage 6, it is required to position the stage base 7 such that the wafer stage 6 and the stage base 7 are moved with accelerations inversely proportional to their masses by the driving force applied to the wafer stage 6 and the reaction force applied to the stage base 7. Under ideal conditions where there is no friction between the stage base 7 and the wafer stage 6 and between the base frame 1 and the stage base 7, and the base frame 1 and the stage base 7 both have ideal surfaces in the horizontal plane, equation (6) holds automatically. In practice, however, there is slight friction even when hydrostatic bearings are used, and the guiding surfaces are not necessarily ideal surfaces in the horizontal plane. Furthermore, interconnecting wires used to drive the linear motors or the like act as springs to moving members. In the present embodiment, the stage base 7 is positioned actively so as to cancel the disturbances described above thereby satisfying equation (6). Because the force required to suppress the disturbances is small, the forces generated by the stage base linear motors 43 and 21 are small, and thus the reaction forces thereof are also small. Thus, the base frame 1 and the floor are not substantially vibrated.

Figure 13:
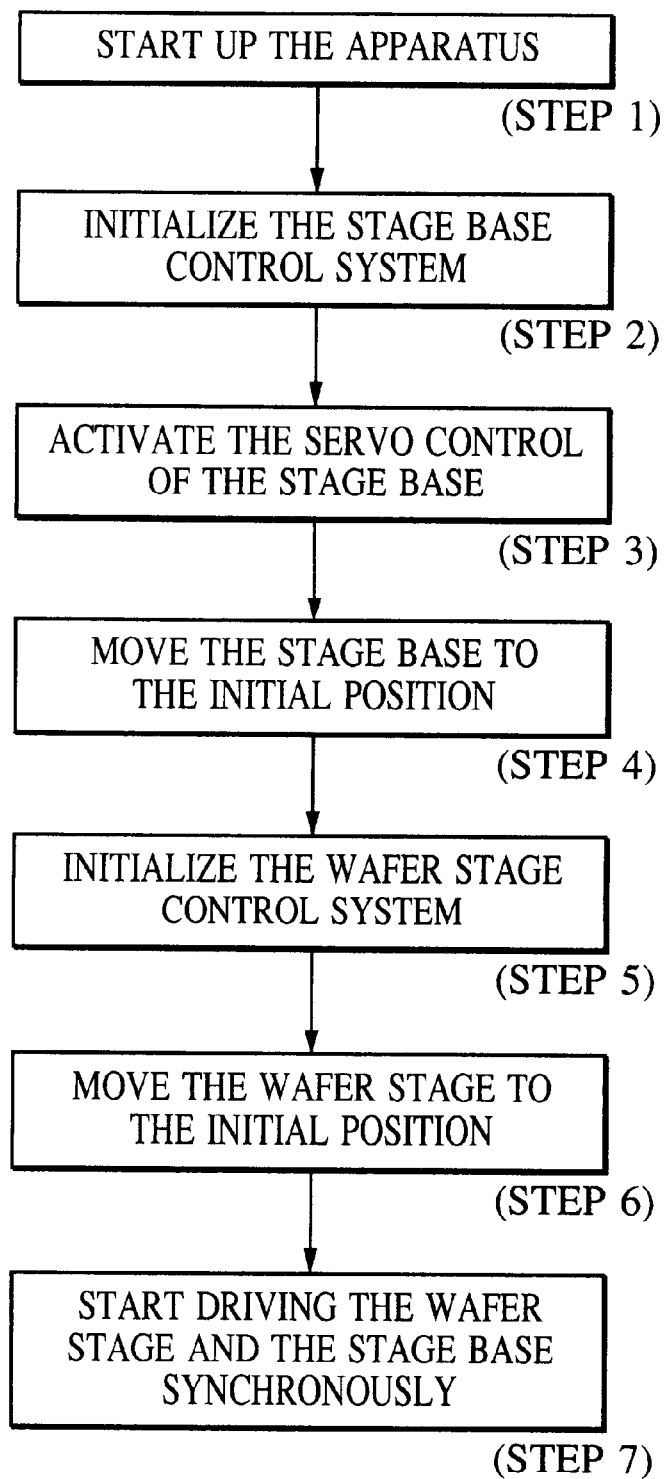
FIG. 13 is a flow chart illustrating the operation of turning on the power of the apparatus shown in FIG. 1 and starting it up.

The operation of turning on the power of the apparatus of the present embodiment and starting it up is described below with reference to the flow chart shown in FIG. 13. First, the electric power to the apparatus is turned on, and the interferometers are reset (step 1). At this stage, it becomes possible to obtain signals output from the interferometers. However, the signals output from the interferometers indicate relative positions of the stage base 7 and the stage 6 but do not indicate the absolute positions thereof.

Subsequently, the stage base 7 is driven to the origin (step 2). Because a single-phase coil is employed in each linear motor for driving the stage base 7, a constant force is generated by passing a particular current through the coil regardless of the relative position between the mover and the stator. While monitoring the velocity of the stage base 7, the stage base 7 is driven at a low fixed speed in the positive X direction and the position Y direction by the stage base X direction linear motors 24 and 26 and the stage base Y direction linear motors 23 and 25. Although not shown in the figures, limit switches (photo switches) are disposed close to the stage base X direction linear motors 24 and 26 and the stage base Y direction linear motors 23 and 25. When the limit switches are turned off as a result of the movement of the stage base 7, the interferometers are reset and the stage base 7 is stopped. After the completion of resetting all laser interferometers used to measure the position of the stage base 7, the servo control associated with the position of the stage base 7 is activated (step 3).

After that, the stage base 7 is moved to its initial position (step 4). At the initial position of the stage base 7, the rotational position about the Z axis is set to a zero position. The positions in the X and Y directions may be arbitrary within the stroke ranges of the X stage 13 and the Y stage 17, as long as equation (6) is satisfied. After moving the stage base 7 to the initial position, the stage base 7 is fixed at the initial position by means of position servo control in which the initial position is employed as the target position.

Subsequently, initialization associated with the wafer stage 6 is performed. The initialization may be performed using a known technique (step 5). When the initialization associated with the wafer stage 6 is completed, it becomes possible to measure the absolute value of the position of the wafer stage 6 with respect to the measurement reference, and thus it becomes possible to move the wafer stage 7 to any desired position by means of position servo control.

After that, the wafer stage 6 is moved to a position which satisfies equation (6) (step 6). During the movement to that position, the stage base 7 is fixed at the initial position, and thus the reaction force of the driving force applied to the wafer stage 6 is transmitted to the base frame 1 via the stage base 7 and the linear motors for driving the stage base 7. However, the driving of the wafer stage 6 to its initial position is not performed very frequently, and the acceleration is not large. Therefore, the transmission of the reaction force of the driving force to the base frame 1 or the floor does not cause a problem.

When the wafer stage 6 is driven after the completion of moving the wafer stage 6 to the initial position, the wafer stage 6 and the stage base 7 are positioned according to target values specified by a wafer stage X position command, a wafer stage Y position command, a stage base X position command, and a stage base Y position command (step 7). After the completion of the initialization of the stage system, equation (6) is always satisfied. Therefore, the initialization is performed once when the apparatus is started up.

In operation of driving the wafer stage 6 to the initial position so as to satisfy equation (6), only the stage base 7 may be driven while maintaining the wafer stage 6 at a fixed position. However, this method is disadvantageous compared to the previous method. In the previous technique in which the measurement system associated with the stage base 7 is initialized and the wafer stage 6 is driven synchronously, the linear motors for driving the stage base 7 are not required to generate a large force, because the stage base 7 is driven at a low speed in the initialization of the measurement system, and only compensation for the friction of the stage base 7 is necessary in the synchronous driving of the wafer stage 6. Therefore, small-sized linear motors may be employed, and thus a reduction in cost can be achieved. In contrast, if the stage base 7 is driven at a high speed in the driving to the initial position, large-sized linear motors are necessary, and the advantages described above are lost. On the other hand, the linear motors for driving the wafer stage 6 are designed to drive the wafer stage 6 at a high speed, and thus they are capable of outputting a large driving force. Therefore, it is desirable to perform the initial driving by moving the wafer stage 6 while maintaining the stage base 7 at a fixed position.

The present invention is not limited to the embodiment described above, and various modifications are possible. For example, although in the embodiment described above, the position reference used in the measurement of the position of the stage base 7 is formed on the lens barrel base 2, the position reference may be formed on the base frame 1. In this case, the position of the wafer stage 6 is measured using a position reference formed on the lens barrel base 2, and thus different position references are used for the measurement of the positions of the stage base 7 and the wafer stage 6. The lens barrel base 2 is supported on the base frame 1 via the vibration isolating mechanism 5. The relative position between the lens barrel base 2 and the base frame 1 is controlled within the accuracy range of several to several ten $\mu$m by a positioning mechanism provided on the vibration isolating mechanism 5. Therefore, strictly speaking, when the stage base 7 is positioned so as to satisfy equation (6), the relative position between the stage 6 and the lens barrel base 2 includes the positioning error of the lens barrel base 2. What is essential to the present invention is that the stage 6 is moved to a desired position within an allowable range while always maintaining the predetermined relative position between the stage 6 and the stage base 7. In this regard, a rather large error such as several ten to several hundred $\mu$m is allowed as the positioning error between the stage 6 and the stage base 7. This means that the above-described positioning error between the base frame 1 and the lens barrel base 2 causes no problem.

Although in the embodiment described above, the stage 6 is formed such that it is allowed to move along two axes, the present invention may also be applied to a stage which is allowed to move along one axis. Furthermore, although in the embodiment described above, linear motors are employed as actuators of the stage base 7, other types of actuators may also be employed. For example, a combination of an AC motor and a pole screw may be used as an actuator. In this case, an encoder may be disposed on a rotational shaft, and the position of the stage base 7 may be determined from the lead of the pole screw and the number of revolutions. Furthermore, although in the embodiment described above, the laser interferometers are employed to measure the positions of the stage 6 and the stage base 7, other types of measuring instruments may also be employed. In the embodiment described above, the present invention is applied to the wafer stage 6. The present invention may also be applied to a reticle stage in a similar manner.

In the embodiment described above, the stage base 7 is supported on the base frame 1 such that the stage base 7 is allowed to freely rotate in the horizontal plane. Alternatively, the stage base 7 may be disposed on a horizontal direct guide. In the embodiment described above, the moment exerted upon the stage base 7 acts upon the base frame 1 via the stage base linear motors. In the case where a direct guide is employed, the moment acts upon the base frame via the direct guide.

Figure 9:
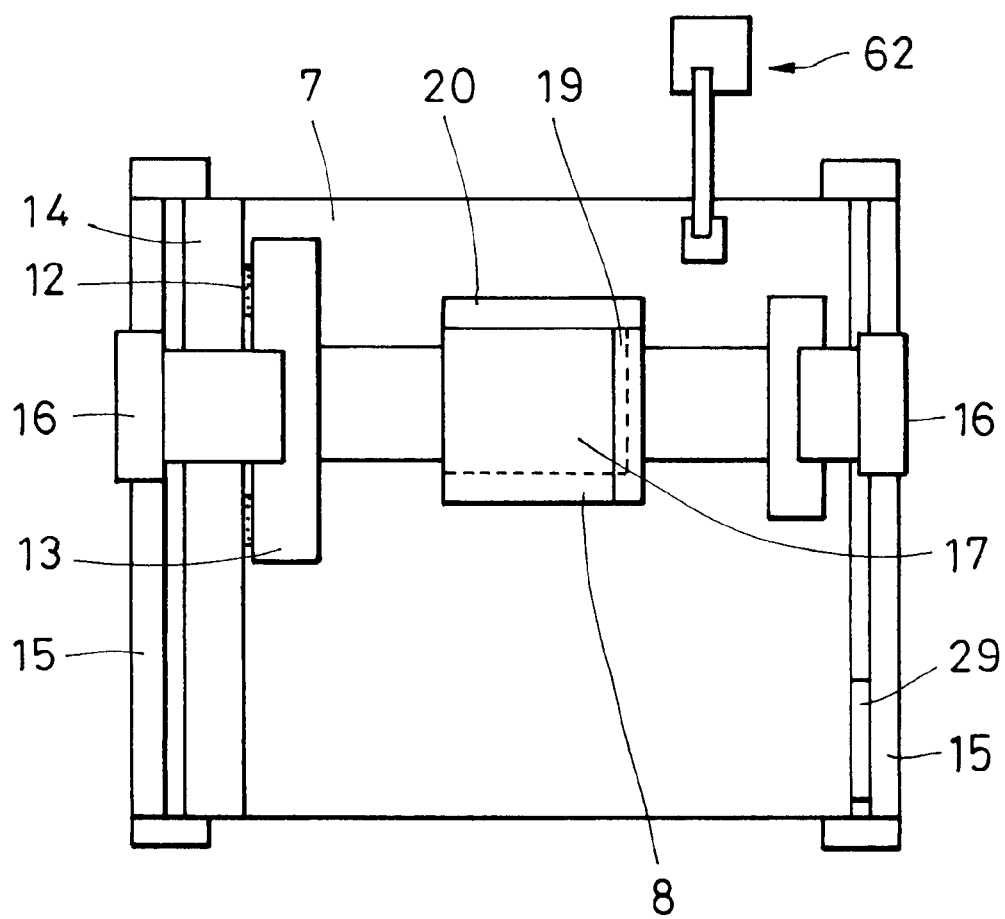
FIG. 9 is a top view illustrating another embodiment of the present invention.
Figure 10:
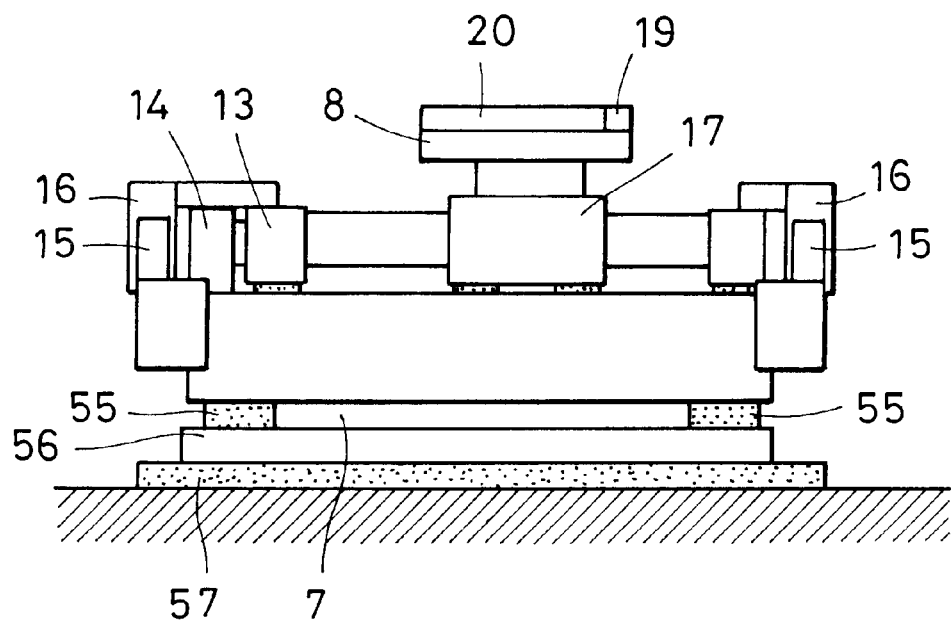
FIG. 10 is a front view of the apparatus shown in FIG. 9.

FIG. 9 is a top view illustrating another embodiment of the present invention, and FIG. 10 is front view thereof. Herein, a Y stage 13, an X stage 17 and a fine adjustment stage 8 are similar to those shown in FIG. 1. A stage base 7 is guided by a stage base Y direction guide 55 such that the stage base 7 is allowed to freely move in the Y direction over a stage base supporting plate 56. The stage base supporting plate 56 is guided by a stage base X direction guide 57 such that the stage base supporting plate 56 is allowed to freely move in the X direction over the base frame. The stage base Y direction guide 55 and the stage base X direction guide 57 are each formed of two linear guides such that the stage base is allowed to freely move in the guiding directions and such that the stage base is rigidly supported in directions perpendicular to the guiding directions. Although not shown in the figures, an absolute encoder is disposed close to the stage base X direction guide 57 thereby measuring the position of the stage base supporting plate 56 in the X direction relative to the base frame. Similarly, another absolute encoder is disposed close to the stage base Y direction guide 55 thereby measuring the position of the stage base 7 in the Y direction relative to the stage base supporting plate 56. Because the stage base supporting plate 56 is guided by the stage base X direction guide 57 over the base frame as described above, the stage base supporting plate 56 has substantially no displacement in the Y direction, and thus the value measured by the absolute encoder in the Y direction can be regarded as precisely representing the position of the stage base 7 in the Y direction relative to the base frame.

Figure 11:
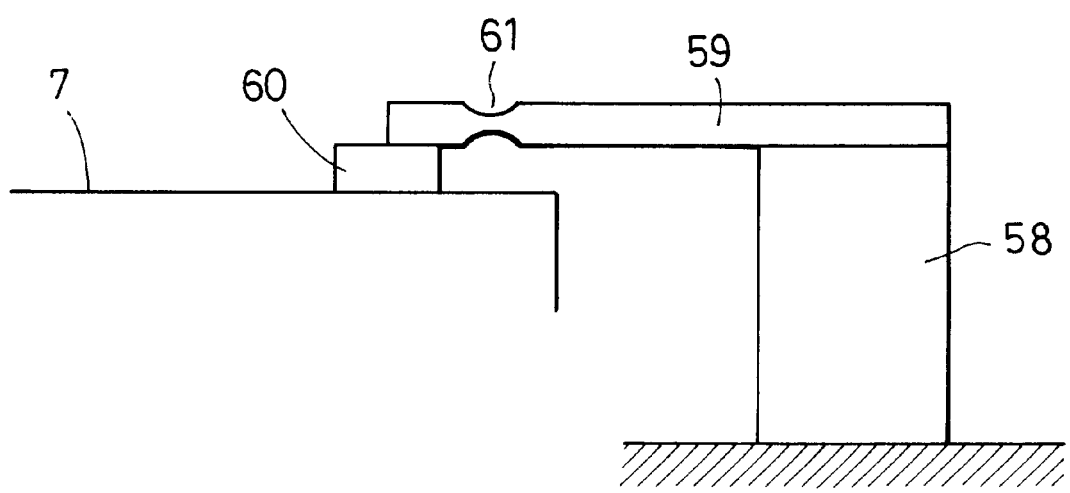
FIG. 11 is a schematic diagram illustrating the structure of a position fixing mechanism used in the apparatus shown in FIG. 9.

The stage base 7 can be fixed by a position fixing mechanism 62 having the structure shown in FIG. 11. A main part 58 is disposed on the base frame, and an arm 59 extends over the stage base 7. An electromagnet 60 is disposed on the end of the arm 59. The surface of the electromagnet 60 facing the upper surface of the stage base 7 is smoothly finished. When the electromagnet 60 is not excited, the lower surface of the electromagnet 60 is spaced by several µm from the upper surface of the stage base 7. In this stage, the lower surface of the electromagnet 60 does not come into contact with the upper surface of the stage base 7 over the stroke range of the stage base 7. Furthermore, the arm 59 and the electromagnet 60 are located such that they do not exert physical interference upon the stage base 7 no matter where the stage base 7 is located. If the electromagnet 60 is excited, a hinge 61 formed on the arm 59 allows the electromagnet 60 to move downward until the electromagnet 60 comes into tight contact with the upper surface of the stage base 7. Although the hinge 61 formed on the arm 59 allows the electromagnet 60 to move in the Z direction, the hinge 61 is rigid in the X and Y directions. Thus, when the electromagnet 60 is excited, the stage base 7 is rigidly fixed to the base frame.

Figure 12:
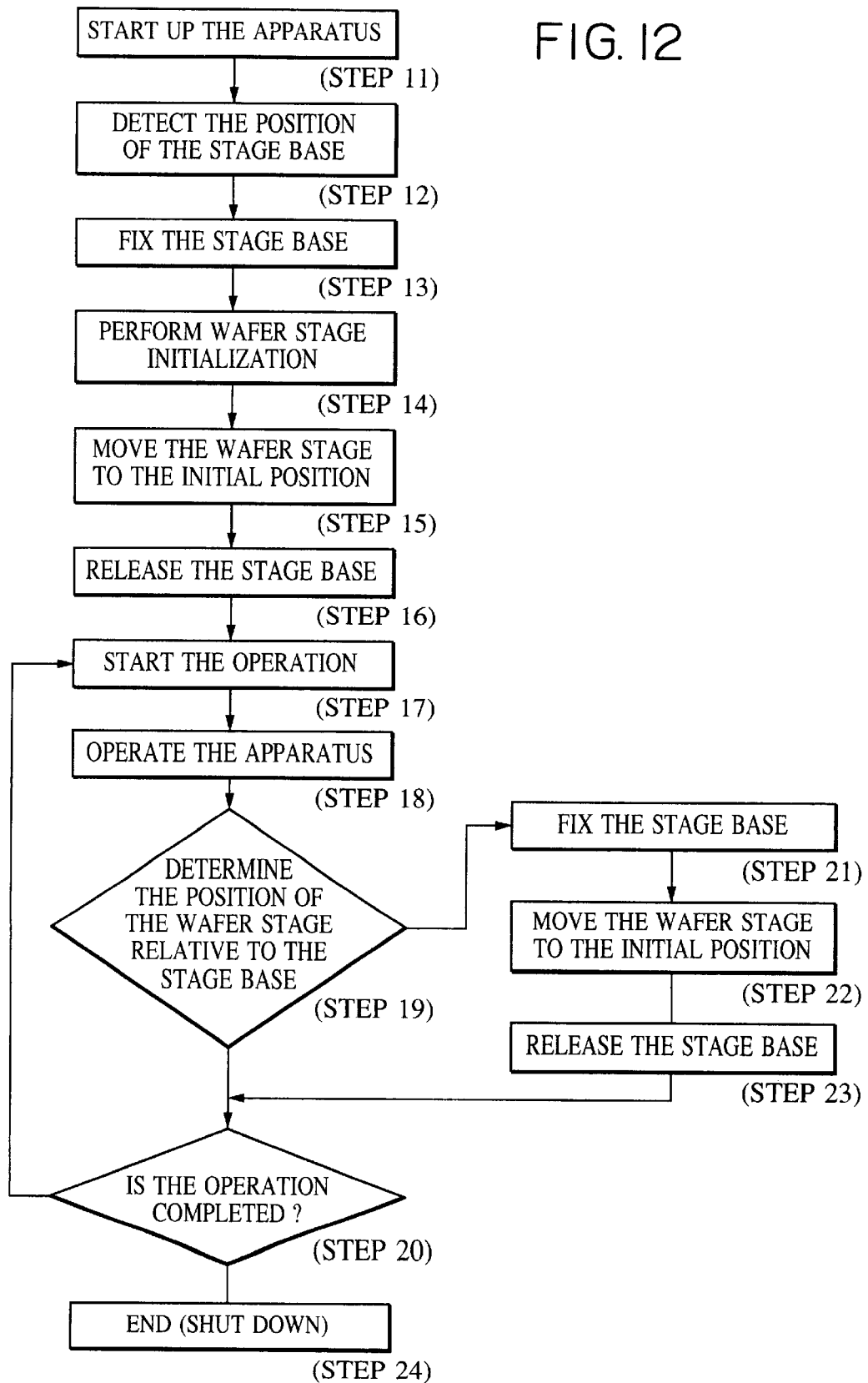
FIG. 12 is a flow chart illustrating the operation of the apparatus shown in FIG. 9.

The motion of this stage system is described below with reference to the flow chart shown in FIG. 12. Before turning on the electric power to the apparatus, positions of the X stage 17, the Y stage 13, the fine adjustment stage 8, and the stage base 7 in the X and Y directions are not known. After the electric power is turned on (step 11), the absolute position of the stage base 7 with respect to the base frame is measured using the absolute encoder of the stage base 7 (step 12). Subsequently, the electromagnet 60 of the stage base position fixing mechanism 62 is excited so as to fix the stage base 7 to the base frame (step 13). Initialization associated with the X stage 17, the Y stage 13, and the fine adjustment stage 8 is then performed using a known technique thereby making it possible to start driving them (step 14). The X stage 17 and the Y stage 13 are driven while fixing the stage base 7 to the base frame, until equation (7) described below is satisfied (step 15).

$$Yb = -my/My \cdot Ys$$

$$Xb = -mx/My \cdot Xs \qquad (7)$$

where

Yb is the target value of the position of the stage base 7 in the Y direction,

Xb is the target value of the position of the stage base 7 in the X direction,

Ys is the target value of the position of the Y stage 13,

Xs is the target value of the position of the X stage 17, my is the total moving stage mass in the Y direction (the sum of the masses of the Y stage 13, the X stage 17, and the fine adjustment stage 8)

mx is the total moving stage mass in the X direction (the sum of the masses of the X stage 17 and the fine adjustment stage 8), and My is the mass of the stage base.

Herein, a unified origin, direction, and dimension are used for the measured value (value of the absolute encoder) of the stage base 7 and of the measured values (values of interferometers) of the X stage 17 and the Y stage 13. When equation (7) is satisfied, the electromagnet 60 of the stage base position fixing mechanism 62 is deactivated (step 16). Thus, the stage base 7 becomes possible to freely move in the X and Y directions with respect to the base frame. Therefore, if the X stage 17 or the Y stage 13 is driven, the reaction force acts upon the stage base 7, and the stage base 7 moves in a direction opposite to the direction in which the X stage 17 or the Y stage 13 moves, wherein the accelerations exerted upon them are inversely proportional to their masses. As a result, the reaction force of the driving force applied to the stage is not transmitted to the base frame, and thus the base frame and the floor are not vibrated by the reaction force. Depending upon the stage position or the driving mode, a moment about the Z axis acts upon the stage base 7. The moment is transmitted to the base frame via the stage base X direction guide 57 and the stage base Y direction guide 55. However, the moment is not so large as to significantly vibrate the base frame or the floor. In this state, the apparatus is operated so as to perform wafer processing or the like (steps 17 and 18).

When the stage is driven repeatedly, slight friction between the stage base 7 and the guides can cause the stage and the stage base 7 to be shifted from the positions which satisfy equation (7). If the shift in position becomes too large, the stage base 7 comes into contact with the stroke limit of the guide of the stage base 7, and thus the reaction force of the driving force applied to the stage is transmitted to the base frame. To avoid the above problem, the position of the stage base 7 is always monitored, and if it is determined that the shift from equation (7) has become very large, the following operation is performed (step 19). That is, the electromagnet 60 of the stage base position fixing mechanism 62 is excited so as to fix the stage base 7 at the present position (step 21). The X stage 17 and the Y stage 13 are then driven properly until they come to positions which satisfies equation (7) (step 22). After completion of the recovering operation described above, the electromagnet 60 of the stage base position fixing mechanism 62 is deactivated, and the driving of the stages in the normal mode is started (step 23). During the recovering operation, the reaction force of the driving force applied to the stages is transmitted to the base frame, because the stage base 7 is fixed to the base frame. However, the recovering operation is not performed very frequently, and the acceleration exerted upon the stage is not large. Therefore, the floor is not significantly vibrated. It is desirable that the recovering operation be performed not during the wafer exposure process but during a period between lots or the like. To this end, it is desirable that the stage base 7 have a large enough margin in terms of the stroke. Subsequently, it is determined whether the wafer processing is completed (step 20), and the operation is restarted or terminated as required (step 24).

The stage system described above allows the stage to be easily driven without exerting vibration upon the floor and without having to use an actuator associated with the stage base 7. Herein, to reduce the cost, linear guides are used as the stage base X direction guide 57 and the stage base Y direction guide 55. Alternatively, other types of guides such as a hydrostatic guide may also be employed.

Embodiment of a Method of Producing a Device

Figure 14:
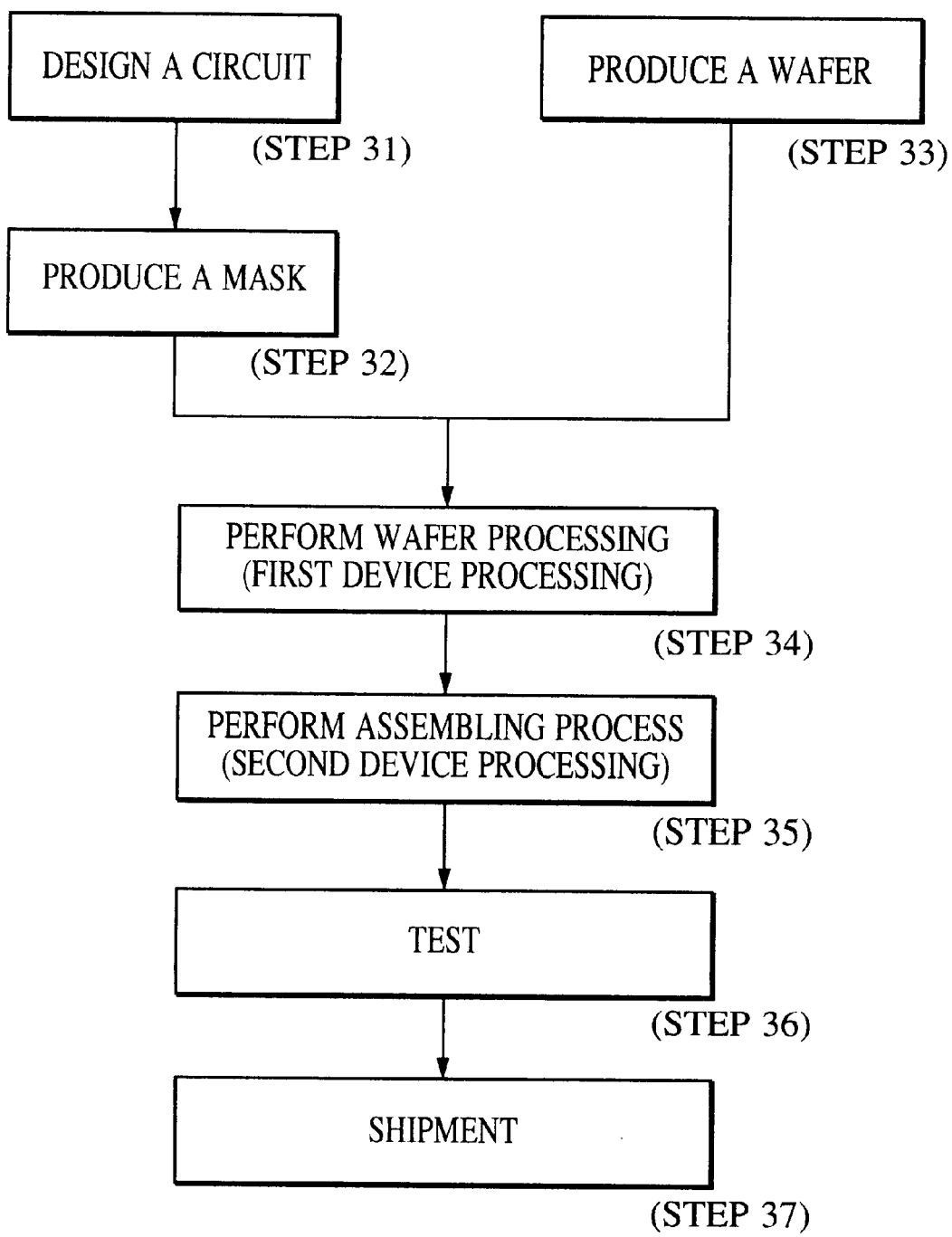
FIG. 14 is a flow chart illustrating a device production process using the exposure apparatus according to the present invention.

An embodiment of a method of producing a device using the exposure apparatus is described below. FIG. 14 is a flow chart illustrating a process of producing a micro device (semiconductor chip such as an IC or LSI, liquid crystal panel, CCD, thin-film magnetic head, micro machine). In step 31 (circuit design), patterns of a device are designed. In step 32 (mask production), masks having the patterns designed in step 31 are produced. On the other hand, in step 33 (wafer production), wafers are produced using silicon or glass. In step 34 (wafer process, also called first device production process), actual circuits are formed on wafers by means of lithography using the masks and wafers prepared in the previous steps. In step 35 (assembly process, also called second device production process), the wafers on which circuits have been formed in step 34 are separated into semiconductor chips, and assembled into packaged form (via dicing, bonding, packaging, molding). In step 36 (test), the operation of the semiconductor devices produced in step 35 is tested, and the reliability thereof is evaluated. The semiconductor devices obtained via the above steps are shipped in step 37.

Figure 15:
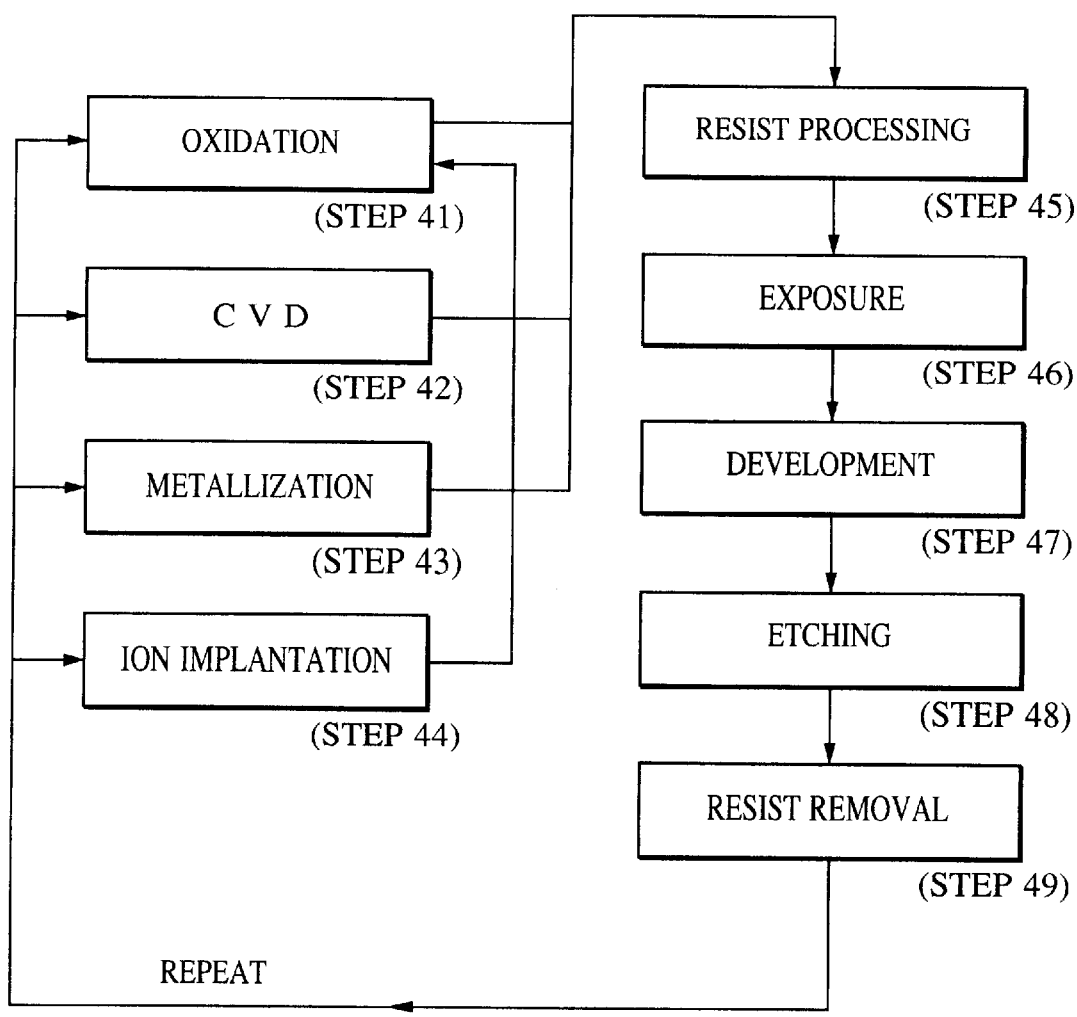
FIG. 15 is a flow chart illustrating the details of the wafer process shown in FIG. 14.

FIG. 15 is a flow chart illustrating the details of the wafer process (step 34). In step 41 (oxidation), the surface of the wafers are oxidized. In step 42 (CVD), an insulating film is formed on the surface of the wafers. In step 43 (metalization), electrodes and interconnections are formed on the wafers by means of vacuum evaporation. In step 44 (ion implantation), ions are implanted into the wafers. In step 45 (resist processing), a resist film is coated on the wafers. In step 46 (exposure), the wafers are exposed to light via the mask having the circuit pattern formed thereon shot by shot using the exposure apparatus described earlier. In step 47 (development), the exposed wafers are developed. In step 48 (etching), the surface of the wafers are etched via the resist pattern formed via the development process. In step 49 (resist removal), the resist film, which has become unnecessary after the completion of the etching process, is removed. The above steps are performed repeatedly so as to form a multi-layer circuit pattern on the wafers. The production method according to the present embodiment makes it possible to produce, at low cost, large-sized devices which are difficult to produce using conventional techniques.

In the present invention, as described above, the second movable member control system positions the second movable member in synchronization with the positioning of the first movable member, thereby allowing the second movable member to be positioned without transmitting the reaction force of the driving force of the first movable member to the floor or the like on which the stage apparatus is installed, and thus preventing degradation in positioning accuracy of the first movable member due to the vibration of the floor which would otherwise occur by the reaction force, and also preventing other apparatus from being influenced by the vibration. Furthermore, the position of the second movable member is controlled such that the desired relative position between the first movable member and the second movable member is maintained and such that the first movable member is allowed to move to any desired position within the allowed range regardless of any motion of the first movable member. Furthermore, the second movable member fixing mechanism for fixing the second movable member and the second movable member position measurement system for measuring the position of the second movable member are provided so as to prevent the first and second movable members from deviating from the correct relative positional relationship, wherein such a deviation will make it impossible to absorb the reaction force from the first movable member. That is, the present invention allows the reaction force, which occurs as a result of motion of the first movable member, to be always absorbed by the second movable member.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompasses all such modifications and equivalent structures and functions.

What is claimed is:

1. A stage apparatus comprising:

a first movable member movable in a direction parallel with a reference plane;

a second movable member movable in a direction parallel with the reference plane;

a first actuator for generating a force to move said first movable member relative to said second movable member;

a second actuator for generating a force to move said second movable member relative to the reference plane;

a first control system for controlling the position of said first movable member, using said first actuator; and a second control system for controlling the position of said second movable member in a direction opposite said first movable member, using said second actuator, in synchronization with the control of said first control system.

2. A stage apparatus according to claim 1, further comprising:

a first position measurement system for measuring the position of said first movable member; and a second position measurement system for measuring the position of said second movable member.

3. A stage apparatus according to claim 2, wherein:

said first control system controls the position of said first movable member on (i) the basis of a result of the measurement performed by said first position measurement system and (ii) the basis of a target value of the position of said first movable member; and said second control system controls the position of said second movable member on (i) the basis of a result of the measurement performed by said second position measurement system and (ii) the basis of a target value of the position of said second movable member.

4. A stage apparatus according to claim 2, wherein a reference member serving as a position reference used in the position measurement performed by said first position measurement system is formed on a structure vibration-isolated from a structure defining the reference plane.

5. A stage apparatus according to claim 2, wherein a reference member serving as a position reference used in the position measurement performed by said first position measurement system is formed integrally with the reference plane.

6. A stage apparatus according to claim 2, wherein a reference member serving as a position reference used in the position measurement performed by said second position measurement system is formed on a structure vibration-isolated from a structure defining the reference plane.

7. A stage apparatus according to claim 2, wherein a reference member serving as a position reference used in the position measurement performed by said second position measurement system is formed integrally with the reference plane.

8. A stage apparatus according to claim 1, wherein said first movable member and said second movable member are both supported on a structure defining the reference plane.

9. A stage apparatus according to claim 1, wherein said second movable member is supported on a structure defining the reference plane, and said first movable member is supported on said second movable member.

10. A stage apparatus according to claim 1, wherein said first movable member and said second movable member are movable in directions along two axes parallel to the reference plane.

11. A stage apparatus according to claim 1, wherein said first movable member is a movable stage, and said second movable member is one of a stage base and a stator of said first actuator.

12. A stage apparatus according to claim 1, wherein said first actuator is a linear motor.

13. A stage apparatus comprising:
a first movable member movable in a direction parallel with a reference plane;
a second movable member movable in a direction parallel with the reference plane;
a first actuator for generating a force to move said first movable member relative to said second movable member;
a second actuator for generating a force to move said second movable member relative to the reference plane;
a first control system for controlling the position of said first movable member, using said first actuator; and
a second control system for controlling the position of said second movable member, using said second actuator, in synchronization with the control of said first control system;
wherein when the mass of said first movable member is denoted by m, a target value of the position of said first movable member controlled by said first control system is denoted by −Ys, the mass of the said second movable member is denoted by M, and a target value of the position of said second movable member is denoted by Yb, the following relationship holds:

$$Yb = -m/M \cdot Ys.$$

14. A stage apparatus comprising:
a first movable member movable in a direction parallel with a reference plane;
a second movable member movable in a direction parallel with the reference plane;
a first actuator for generating a force to move said first movable member relative to said second movable member;
a second actuator for generating a force to move said second movable member relative to the reference plane;
a first control system for controlling the position of said first movable member, using said first actuator;
a second control system for controlling the position of said second movable member, using said second actuator, in synchronization with the control of said first control system; and
an initial position actuator for moving said first movable member and said second movable member to initial positions.

15. A stage apparatus according to claim 14, wherein said initial position actuator moves said first movable member while maintaining said second movable member at a fixed position.

16. A stage apparatus comprising:
a first movable member movable in a direction parallel with a reference plane;
a second movable member movable in a direction parallel with the reference plane;
an actuator for generating a force to move said first movable member relative to said second movable member;
a fixing mechanism for fixing said second movable member at an arbitrary position within a moving range of said second movable member;
a position measurement system for measuring the position of said second movable member;
a control system for controlling the position of said first movable member, using said actuator; and
a controller which positions said first movable member so as to satisfy the following relationship:

$$Yb = -m/M \cdot Ys$$

where m is the mass of the first movable member, Ys is a target value of the position of said first movable member controlled by said control system, M is the mass of said second movable member, and Yb is a target value of the position of said second movable member,
wherein said controller releases said second movable member from the fixed state after completion of the positioning of the first movable member.

17. A stage apparatus according to claim 16, further comprising a judging unit for judging whether the relationship is satisfied.

18. A stage apparatus according to claim 17, wherein if said judging unit judges that the relationship is not satisfied, said controller again performs positioning of said first movable member.

19. A stage apparatus according to claim 16, wherein a reference member serving as a position reference used by said position measurement system is formed on a structure vibration-isolated from a structure defining the reference plane.

20. A stage apparatus according to claim 16, wherein a reference member serving as a position reference used by said position measurement system is formed integrally with the reference plane.

21. A stage apparatus according to claim 16, wherein said first movable member and said second movable member are both supported on a structure defining the reference plane.

22. A stage apparatus according to claim 16, wherein said second movable member is supported on a structure defining the reference plane, and said first movable member is supported on said second movable member.

23. A stage apparatus according to claim 16, wherein said first movable member and said second movable member are movable in directions along two axes parallel to the reference plane.

24. A stage apparatus according to claim 16, wherein said first movable member is a movable stage, and said second movable member is one of a stage base and a stator of said actuator.

25. A stage apparatus according to claim 16, wherein said actuator is a linear motor.

26. An exposure apparatus comprising:
a first movable member movable in a direction parallel with a reference plane;
a second movable member movable in a direction parallel with the reference plane;
a first actuator for generating a force to move said first movable member relative to said second movable member;
a second actuator for generating a force to move said second movable member relative to the reference plane;
a first control system for controlling the position of said first movable member, using said first actuator; and
a second control system for controlling the position of said second movable member in a direction opposite said first movable member, using said second actuator, in synchronization with the control of said first control system.

27. An exposure apparatus comprising:

a first movable member movable in a direction parallel with a reference plane;

a second movable member movable in a direction parallel with the reference plane;

an actuator for generating a force to move said first movable member relative to said second movable member;

a fixing mechanism for fixing said second movable member at an arbitrary position within the moving range of said second movable member;

a position measurement system for measuring the position of said second movable member;

a control system for controlling the position of said first movable member, using said actuator; and a controller which positions said first movable member so as to satisfy the following relationship:

$$Yb = -m/M \cdot Ys$$

where m is the mass of the first movable member, Ys is a target value of the position of said first movable member controlled by said control system, M is the mass of said second movable member, and Yb is a target value of the position of said second movable member, wherein said controller releases said second movable member from the fixed state after completion of the positioning of the first movable member.

* * * * *

UNITED STATES PATENT AND TRADEMARK OFFICE
CERTIFICATE OF CORRECTION

PATENT NO. : 6,654,098 B2
DATED : November 25, 2003
INVENTOR(S) : Toshiya Asano et al.

It is certified that error appears in the above-identified patent and that said Letters Patent is hereby corrected as shown below:

Drawings,
Sheet 3, Fig. 4, item 44, "STAGE X" should read -- STAGE BASE X --.

Column 4,
Line 18, "the the" should read -- the --.

Column 7,
Line 32, "surround" should read -- surrounds --.

Column 15,
Line 62, "passes" should read -- pass --.

Signed and Sealed this

Tenth Day of August, 2004

JON W. DUDAS
*Acting Director of the United States Patent and Trademark Office*